United States Patent
Fujioka

(10) Patent No.: US 10,687,414 B2
(45) Date of Patent: Jun. 16, 2020

(54) CIRCUIT BOARD

(71) Applicant: Ricoh Company, Ltd., Tokyo (JP)

(72) Inventor: Daisuke Fujioka, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/009,397

(22) Filed: Jun. 15, 2018

(65) Prior Publication Data

US 2018/0376581 A1 Dec. 27, 2018

(30) Foreign Application Priority Data

Jun. 26, 2017 (JP) .................................. 2017-124666

(51) Int. Cl.
| | |
|---|---|
| H05K 1/02 | (2006.01) |
| H05K 1/18 | (2006.01) |
| H05K 1/11 | (2006.01) |
| H01R 12/71 | (2011.01) |
| H01R 12/72 | (2011.01) |

(52) U.S. Cl.
CPC .......... H05K 1/0228 (2013.01); H05K 1/0219 (2013.01); H05K 1/115 (2013.01); H05K 1/181 (2013.01); H01R 12/716 (2013.01); H01R 12/722 (2013.01); *H05K 1/025* (2013.01); *H05K 2201/09609* (2013.01); *H05K 2201/10189* (2013.01); *H05K 2201/10356* (2013.01)

(58) Field of Classification Search
CPC ...... H05K 1/0228; H05K 1/115; H05K 1/181; H01R 12/716; H01R 12/722
USPC ................................................................ 439/55
See application file for complete search history.

(56) References Cited

U.S. PATENT DOCUMENTS

| | | | | |
|---|---|---|---|---|
| 7,098,680 | B2* | 8/2006 | Fukushima | G01R 31/2889 324/756.02 |
| 7,355,125 | B2* | 4/2008 | Becker | H05K 1/0262 174/255 |
| 7,359,178 | B2* | 4/2008 | Feichtinger | H01C 1/144 361/306.3 |
| 8,319,116 | B2* | 11/2012 | Martinez-Vargas | H05K 1/116 174/260 |

(Continued)

FOREIGN PATENT DOCUMENTS

| | | |
|---|---|---|
| JP | 2001-251063 | 9/2001 |
| JP | 2004-055988 | 2/2004 |

(Continued)

*Primary Examiner* — Alexander Gilman
(74) *Attorney, Agent, or Firm* — Xsensus LLP

(57) ABSTRACT

A circuit board has a base layer composed of multiple layers, and the base layer includes a connector to which a wire harness carrying a signal is coupled, the connector being fixed to a slot for mounting, and a plurality of GND plane patterns arranged in a plurality of layers and electrically coupled to each other through at least one via. Each one of the multiple layers of the base layer includes one of the plurality of GND plane patterns. In and around an area in which the connector is disposed, each one of the plurality of GND plane patterns is provided for a respective one of the multiple layers. The at least one via is arranged around the area in which the connector is disposed. The base layer includes a frame, and at least one via is arranged in the frame.

15 Claims, 6 Drawing Sheets

(56) References Cited

U.S. PATENT DOCUMENTS

| | | | | |
|---|---|---|---|---|
| 8,371,316 B2* | 2/2013 | Humphrey | ............... | B08B 1/00 |
| | | | | 134/93 |
| 8,834,182 B2* | 9/2014 | Clayton | ................ | H01R 12/78 |
| | | | | 439/67 |
| 9,130,297 B2* | 9/2015 | Xiao | .................... | H01R 13/512 |
| 9,265,148 B2* | 2/2016 | Lassmann | ............ | H05K 1/0206 |
| 9,991,621 B2* | 6/2018 | Wagner | .................. | H01R 24/58 |
| 2012/0026571 A1* | 2/2012 | Uken | ..................... | B60R 1/088 |
| | | | | 359/267 |

FOREIGN PATENT DOCUMENTS

| | | |
|---|---|---|
| JP | 2009-188351 | 8/2009 |
| JP | 2011-040703 | 2/2011 |

\* cited by examiner

CIRCUIT BOARD

CROSS-REFERENCE TO RELATED APPLICATION

This patent application is based on and claims priority pursuant to 35 U.S.C. § 119(a) to Japanese Patent Application No. 2017-124666, filed on Jun. 26, 2017, in the Japan Patent Office, the entire disclosure of which is hereby incorporated by reference herein.

BACKGROUND

Technical Field

Embodiments of the present disclosure relate to an improved circuit board.

Background Art

Conventionally, compared with information processing devices such as a smartphone, strict electromagnetic compatibility (EMC) requirements govern electronic devices for medical purposes, electronic devices for vehicle-installed purposes, or electronic devices for aerospace purposes. With signal processing speed increasing, signals that operate signal lines at high speeds (such as clock signals or data bus signals) become a source of high-frequency noise. Thus, for example, the wire harnesses coupled to circuit boards of electronic devices and used in place of antennas radiate amplified noise and for this reason the electromagnetic interference (EMI) or noise radiated from these products exceeds permissible levels set by EMC regulations. In order to be in compliance, some countermeasures need to be taken.

For example, to block edge noise, where the noise conducted inside the circuit board is radiated from edges of the circuit board, circuit boards that adopt an electromagnetic band-gap (EBG) structure are known in the art. In such EBG structures, a through-via that couples a plurality of conductive boards is formed along the sides of the multi-layer circuit board, across the conductive boards arranged on different levels, and the uppermost conductive board is coupled to the ground layer of the circuit board. With such EBG structures, EMI noise radiating from the edges of the circuit board can be contained.

SUMMARY

Embodiments of the present disclosure described herein provide a circuit board having a base layer composed of multiple layers. The base layer includes a connector to which a wire harness carrying a signal is coupled, the connector being fixed to a slot for mounting, and a plurality of GND plane patterns arranged in a plurality of layers and electrically coupled to each other through at least one via.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

Figure 1:
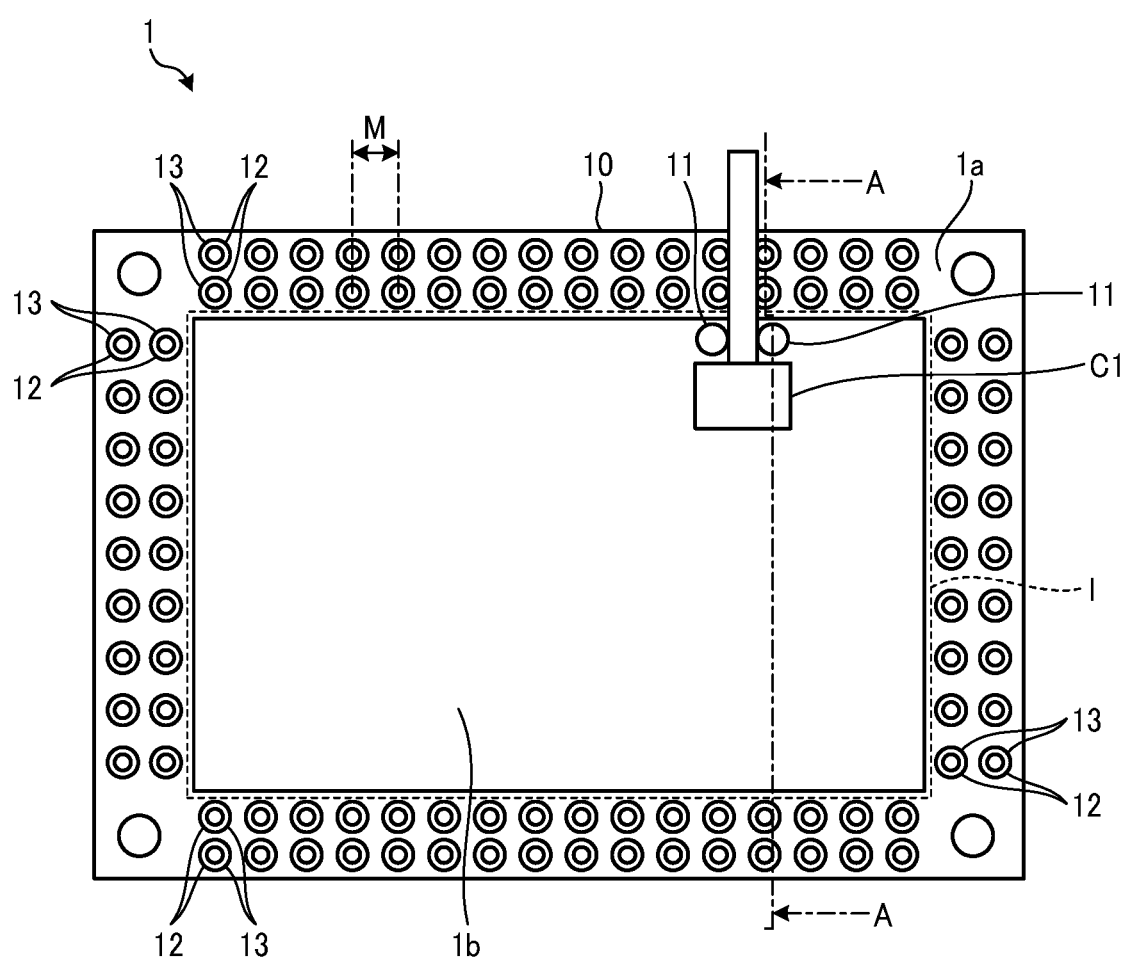
FIG. 1 is a plan view of a circuit board according to an embodiment of the present disclosure.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

A circuit board according to an embodiment of the present disclosure will be described below in detail with reference to the accompanying drawings.

The circuit board according to the present embodiment is a multi-layer printed circuit board. In the present embodiment, a layered product in which a plurality of layers is formed is referred to as a base layer. For example, a board formed by the build-up process and a lead-through multi-layer board are used as such a base layer. The circuit board according to the present embodiment is provided with a connector that connects a wire harness that transmits electrical signals, and the connector is connected to the circuit board through a slot for mounting of the base layer where the connector is fastened to the circuit board by a screw or the like.

In the present embodiment, the base layer has a ground (GND) plane pattern in each layer, and is further provided with via holes (vias) through which the GND plane patterns are electrically connected to each other. Such vias are through-holes or non-through-holes, and each of the vias has plating on the inner surface of the hole through which the GND plane patterns of the multiple layers are electrically connected to each other. Due to the configuration described above in the circuit board according to the present embodiment, the connection impedance between the connector (in particular, the metallic cover of the connector) and the GND plane patterns of the base layer is lowered, thereby preventing noise currents from flowing into the connector.

Figure 2:
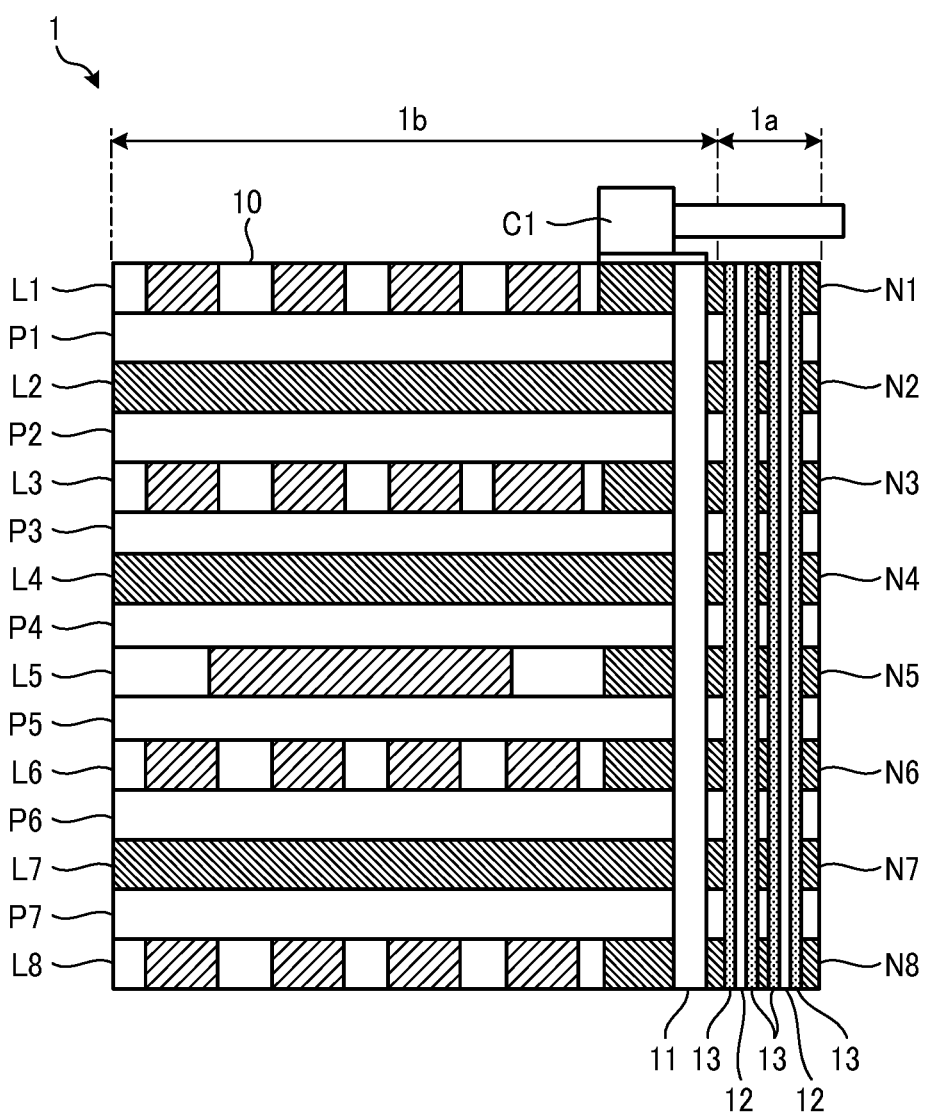
FIG. 2 is a sectional view of a base layer of the circuit board along the line A-A as illustrated in FIG. 1, around a slot for mounting.

FIG. 1 is a plan view of a circuit board 1 according to the present embodiment. FIG. 2 is a sectional view of a base layer 10 of the circuit board 1 along the line A-A as illustrated in FIG. 1, around a slot for mounting 11, according to the present embodiment.

In the circuit board 1 as illustrated in FIG. 1, the base layer 10 is provided with the slots for mounting 11 provided for a connector C1, and has two rows of vias 12 on a frame 1a around the periphery of the base layer 10.

The frame 1a indicates the area outside broken lines I in the base layer 10, and is provided in order to arrange the vias 12 thereon. The area inside the broken lines I is referred to as a central area 1b. Circuits such as a power supply circuit and a signal processing circuit are integrated in the central area 1b, and the connector C1 is mounted through the slots for mounting 11.

The vias 12 are through-holes that penetrate the base layer 10 in the thickness direction (i.e., the depth direction in FIG. 1), and are arranged such that the intervals M between the neighboring through-holes become equal to or shorter than 10 millimeters (mm). For example, the vias 12 are formed as follows. Firstly, through-holes are formed on the base layer 10 by a high-speed drill, and then a plating 13 is formed by coating the inner surface of the through-holes with plating. The processes of plating are performed as known in the art, and thus its detailed description herein is omitted.

As illustrated in FIG. 2, the base layer 10 has the first layer L1 to the eighth layer L8, and the neighboring pairs of the first layer L1 to the eighth layer L8 are bonded together by dielectric layers P1 to P7, respectively. In the present embodiment, a base layer with eight layers is described by way of example as a base layer of multi-layer structure. However, the number of the layers of a base layer may be changed as desired.

In the central area 1b of the base layer 10, the second layer L2, the fourth layer L4, and the seventh layer L7 are the layers of GND plane pattern (L2, L4, L7), and the fifth layer L5 is the layer of power-supply plane pattern. The first layer L1, the third layer L3, the sixth layer L6, and the eighth layer L8 is the layer of signal pattern. All of the above patterns are formed by a conductive material (for example, a copper foil).

In the frame 1a of the base layer 10, the GND plane patterns N1 to N8 that are made of a conductive material (for example, a copper foil) are provided for all the layers (i.e., the first layer L1 to the eighth layer L8). The GND plane patterns N1 to N8 are also provided for all the layers (i.e., the first layer L1 to the eighth layer L8) of the area in which the connector C1 is disposed. For example, the known build-up process is adopted and the GND plane patterns N1 to N8 are formed, for example, by etching a conductive material (for example, a copper foil) together with other circuit patterns of each layer.

The vias 12 penetrate the GND plane pattern in the multiple layers, and each of the vias 12 has the plating 13 on the inner surface. The plating 13 is a conductive material (for example, copper (Cu)), and makes all the layers of the GND plane patterns N1 to N8 become electrically conductive with each other.

Figure 3:
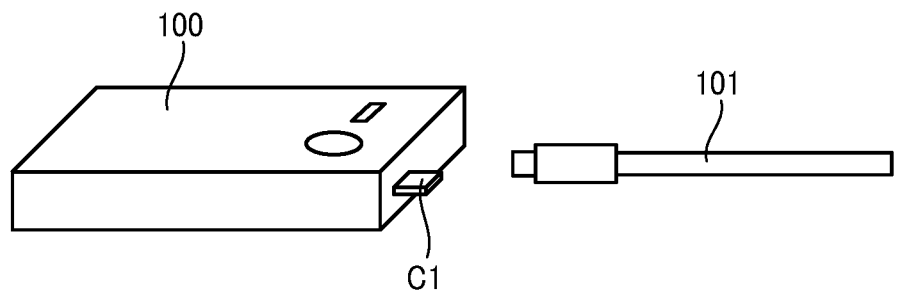
FIG. 3 is a schematic view of an electronic device and a wire harness, according to an embodiment of the present disclosure.
Figure 4:
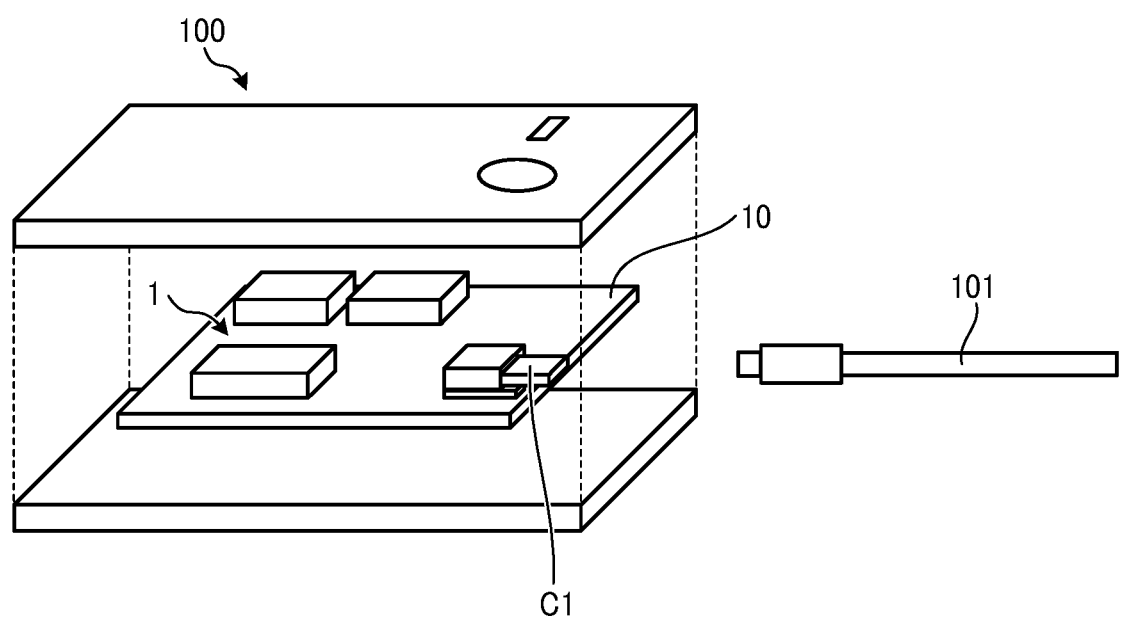
FIG. 4 is an exploded schematic view of an electronic device according to an embodiment of the present disclosure.

FIG. 3 and FIG. 4 are diagrams illustrating how an electronic device 100 and a wire harness 101 are connected to each other, according to the present embodiment.

FIG. 3 is a schematic view of the electronic device 100 and the wire harness 101 according to the present embodiment. FIG. 4 is an exploded schematic view of the electronic device 100 according to the present embodiment.

As illustrated in FIG. 3, the plug of the wire harness 101 that transmits an electric signal is connected to the connector C1 of the electronic device 100. As illustrated in FIG. 4, the circuit board 1 is accommodated inside the housing of the electronic device 100, and the connector C1 is fastened to the slot for mounting 11 of the base layer 10 by a screw or the like, having a fixture or the like therebetween. A plug of the wire harness 101 on one end is coupled to the connector C1, and a different circuit board (for example, a flexible printed circuit board) is coupled to the plug on the other end.

For example, the electronic device 100 may be an on-vehicle electronic device (for example, a vehicle-installed camera). In vehicle-installed electronic devices, a printed circuit that is dedicated to vehicle-installed devices is provided for the central area 1b of the circuit board 1. Similarly, in the electronic device 100 for medical purposes or the electronic device 100 for aerospace purposes, a printed circuit that is dedicated to each of the purposes is provided for the central area 1b of the circuit board 1. The circuit board 1 may be applied to, for example, electronic devices for medical purposes, electronic devices for vehicle-installed purposes, and electronic devices for aerospace purposes subject to strict electromagnetic compatibility (EMC) regulations.

As described above, according to the present embodiment, the GND plane patterns N1 to N8 that are provided for the respective layers are electrically coupled to each other through the vias 12. Accordingly, even in a design where no plating is formed on the slot for mounting 11 for the connector C1, the connection impedance between the connector C1 (more specifically, the metallic cover of the connector C1) and the ground (GND) of the base layer 10 becomes as low as that of the conventional connection impedance, and the noise current can be prevented from flowing into the connector C1. As a result, the noise radiated from a product (electronic device) that is provided with the circuit board 1 according to the present embodiment can be kept within permissible limits, in compliance with EMC regulations.

For example, if the plating of the slot for mounting 11 for the connector C1 is just omitted, a frequency equal to or higher than 1 gigahertz (GHz), for example, the band of 1.6 GHz, deteriorates, and the EMC standards for on-vehicle electronic devices are not satisfied. However, if the GND plane patterns N1 to N8 and the vias 12 are additionally provided and the plating 13 is formed onto the vias 12 as in the circuit board 1 according to the embodiment as described above, such deterioration is avoided, and the EMC standards for on-vehicle electronic devices can be satisfied.

<First Modification>

Circuit integration density in the central area 1b may be increased by increasing the thickness of inner wiring and narrowing the width of wiring, and the available space of the integrated central area 1b may be used as the frame 1a or a part of the frame 1a.

Figure 5:
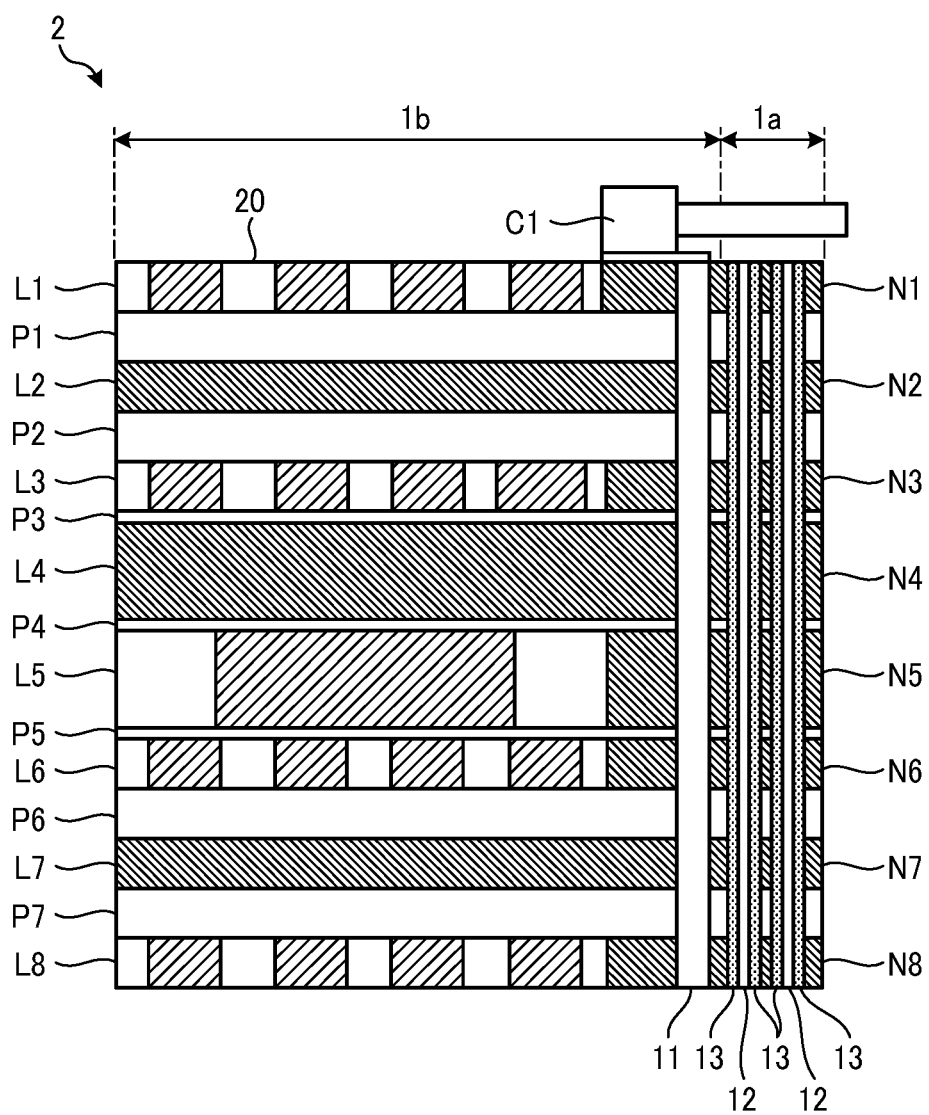
FIG. 5 is a sectional view of a circuit board according to a first modification of an embodiment of the present disclosure.

FIG. 5 is a sectional view of a circuit board 2 according to a first modification of the above embodiment. In FIG. 5, the sectional view of a base layer 20 according to the first modification along the line A-A as illustrated in FIG. 1, around one of the slots for mounting 11, is illustrated.

As illustrated in FIG. 5, in a circuit board 2 of a base layer 20 according to a first modification of the above embodiment, the thickness of the fourth layer L4 and the fifth layer L5 that serve as power-supply layers (i.e., the thickness of inner wiring) is increased. By increasing the thickness of the power-supply layers, the electrical charge through the section of the power-supply layers per unit time increases. When the same current is to be passed through, the width of inner wiring can be narrowed. Accordingly, the area for wiring of the power-supply layer can be reduced.

As the area for wiring of the power-supply layer is reduced, the area of the entire layer can also be reduced. Moreover, when the vias 12 are to be arranged, the size of the circuit board 2 can be minimized.

<Second Modification>

In the embodiment of the present disclosure as described above, the slots for mounting 11 may be arranged on the central area 1b side in an inward direction with reference to the rows of the vias 12. Yet such an arrangement may be reversed. In other words, the slots for mounting 11 may be arranged on the frame 1a side in an outward direction with reference to the rows of the vias 12.

Figure 6:
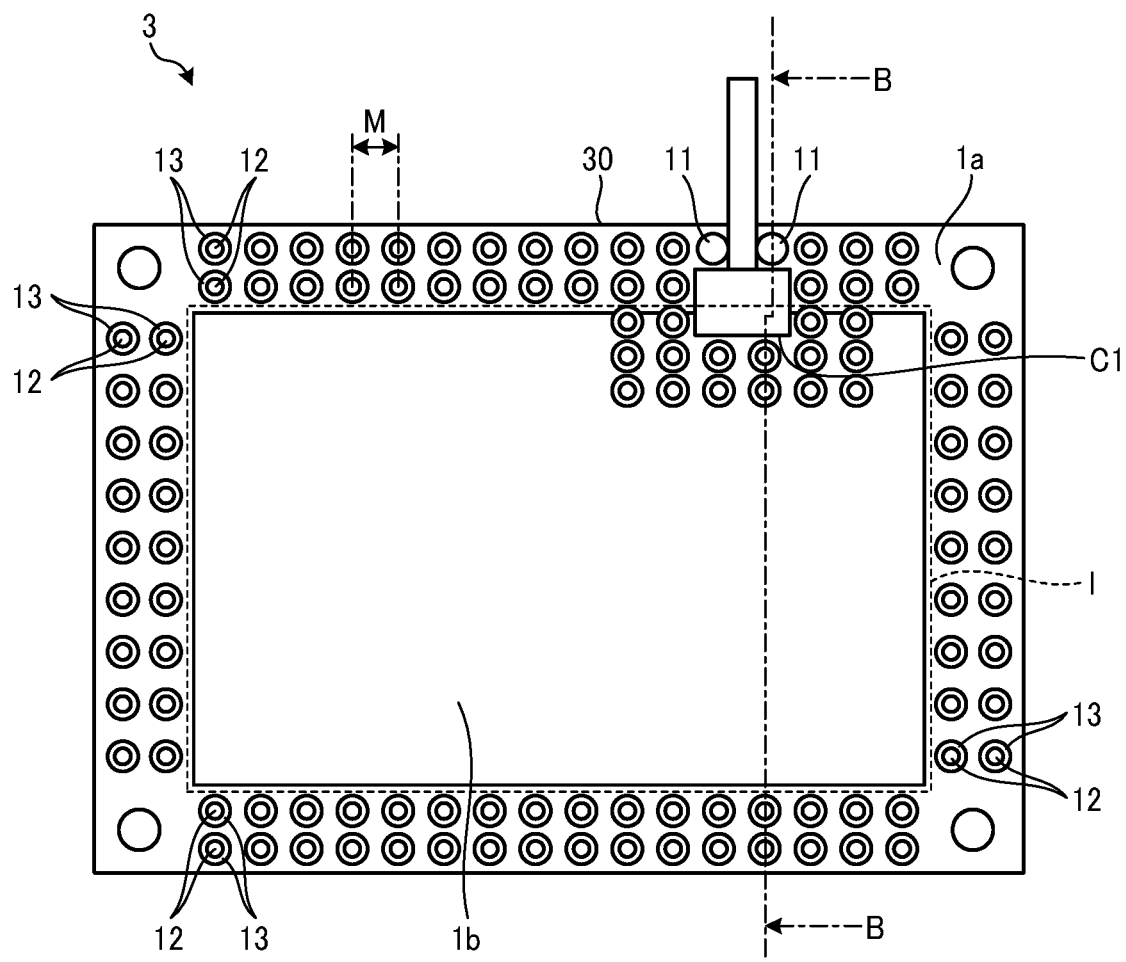
FIG. 6 is a plan view of a circuit board according to a second modification of an embodiment of the present disclosure.
Figure 7:
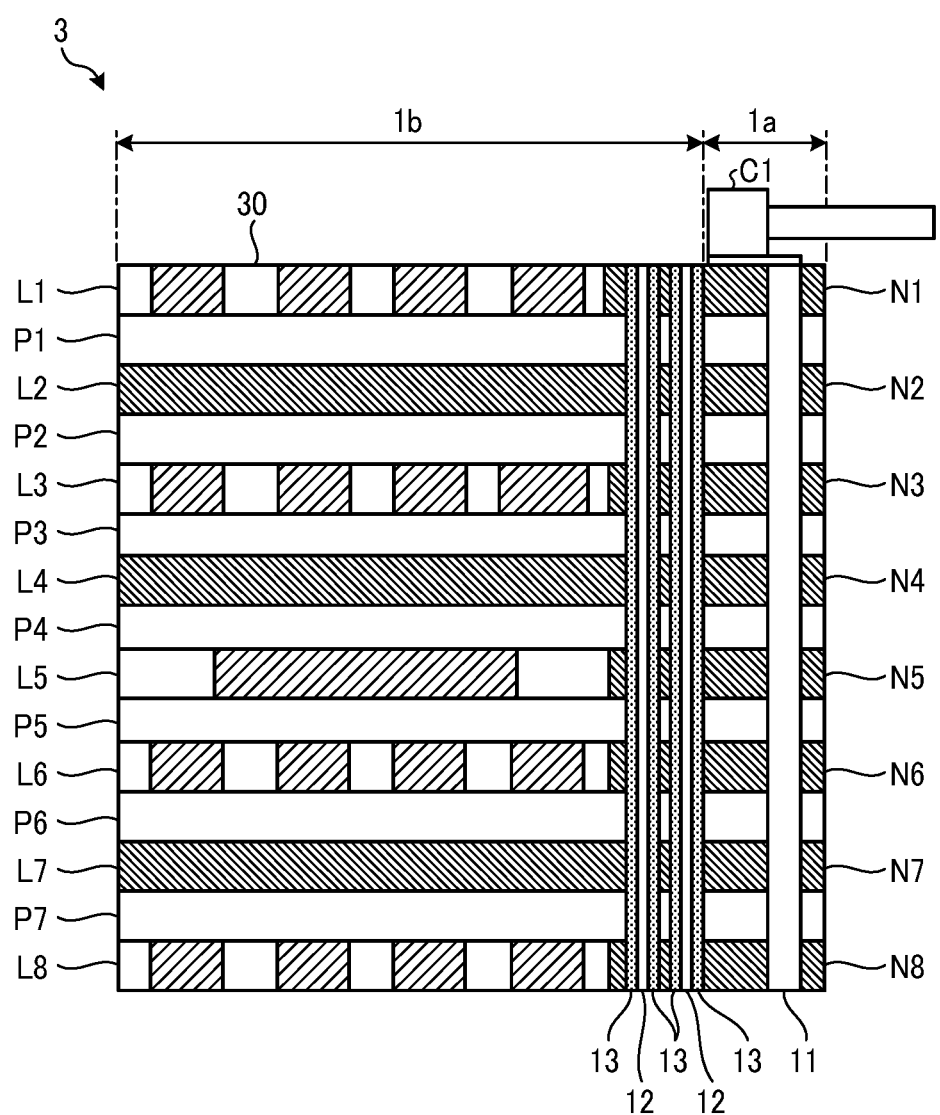
FIG. 7 is a sectional view of a base layer of the circuit board along the line B-B as illustrated in FIG. 6, around a slot for mounting.

FIG. 6 and FIG. 7 are schematic diagrams of a circuit board 3 according to a second modification of the above embodiment. FIG. 6 is a plan view of the circuit board 3 according to the second modification. FIG. 7 is a sectional view of a base layer 30 of the circuit board 3 along the line B-B as illustrated in FIG. 6, around the slot for mounting 11, according to the second modification.

As illustrated in FIG. 6, in a circuit board 3 of a base layer 30 according to a second modification of the above embodiment, the slots for mounting 11 are arranged on an outer edge of the frame 1a. In such a configuration, the connector C1 is shifted to the edge of the frame 1a compared with the arrangement as illustrated in FIG. 1. Accordingly, it becomes easier to couple the wire harness 101 (see FIG. 4) to the connector C1.

The vias 12 detour around the connector C1 and are arranged around the periphery of the connector C1. In the present modification, some of the vias 12 are arranged on a part of the central area 1b. However, as long as the electronic device is mountable, the frame 1a may be broadened and the displaced vias 12 may be accommodated within the frame 1a.

Even when some of the vias 12 need to be arranged on a part of the central area 1b as illustrated in FIG. 6, the vias 12 or the GND plane pattern in the multiple layers are arranged such that the vias 12 electrically connect the GND plane patterns of the multiple layers to each other. For example, the GND plane pattern is provided for all the layers in the central area 1b where the vias 12 are arranged as illustrated in FIG. 6. When a signal pattern or the like exists in some of the layers near the vias 12 as arranged in FIG. 6, the vias 12 and the GND plane patterns are arranged so as to avoid such a signal pattern or the like.

When a through-hole cannot be formed on the base layer 30 due to a signal pattern or the like present in some of the layers in the central area 1b, a non-through-hole may be formed in some of the layers or all the layers in a shifted manner so as to avoid such a signal pattern or the like in the on-target layer. The inner surface of the non-through-holes is coated to form the plating, and the GND pattern in the upper layer and the GND plane pattern in the lower layer are electrically connected to each other through the plating. Due to this configuration, the GND plane pattern in all the layers are electrically connected to each other through the plating of the non-through-hole provided for each of the layers.

In the above embodiment and the above modifications of the embodiment, two rows of vias 12 are provided for the base layers 10, 20, and 30. However, for example, the layout of the vias 12 and the number of the vias 12 may be changed as desired. For example, depending on the intervals between the slots for mounting 11, the depth of the slots for mounting 11, the dimensions of the inner surface of the slots for mounting 11, the diameter of the vias 12, or the intervals between the vias 12, the number of rows of the vias 12 may be increased to three, or the vias 12 may be arranged only in the proximity of the slots for mounting 11. Alternatively, the number of the vias 12 may be changed as desired.

The shape of the vias 12 is not necessarily cylindrical and may be changed as desired. For example, the vias 12 may be shaped like a mortar, or the shape of the vias 12 may be polygonally cylindrical.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A circuit board, comprising:
   a base layer having a multi-layer structure that includes multiple layers, a plurality of dielectric layers, a plurality of ground (GND) patterns and a slot, wherein each dielectric layer of the plurality of dielectric layers is bonded between different layers of the multiple layers, the plurality of GND patterns is arranged in a portion of the multi-layer structure so that the plurality of GND patterns are provided to all layers of the multiple layers, and the plurality of GND patterns are electrically coupled to each other through at least one row of vias disposed on a perimeter of the circuit board; and
   a connector configured to couple to a wire harness carrying a signal, the connector being fixed to the slot, wherein
   the multiple layers include at least two power supply layers, and a thickness of the at least two power supply layers is greater than a thickness of other layers in the multiple layers, and
   the plurality of dielectric layers include first dielectric layers arranged in contact with at least one of the at least two power supply layers and second dielectric layers that are not arranged in contact with at least one of the at least two power supply layers, and a thickness of each of the first dielectric layers is smaller than a thickness of each of the second dielectric layer in the plurality of dielectric layers.

2. The circuit board according to claim 1, wherein in and around an area in which the connector is disposed, each GND pattern of the plurality of GND patterns is provided for a respective layer of the multiple layers.

3. The circuit board according to claim 2, wherein the at least one via is arranged around the area in which the connector is disposed.

4. The circuit board according to claim 3, wherein
   the base layer further includes a frame, and
   the at least one via is arranged in the frame.

5. The circuit board according to claim 4, further comprising a plurality of vias arranged in rows.

6. The circuit board according to claim 5, the plurality of vias are arranged in two rows around a periphery of the base layer.

7. The circuit board according to claim 6, wherein the plurality of vias is arranged at an interval equal to or narrower than 10 mm.

8. The circuit board according to claim 7, wherein the vias do not overlap.

9. The circuit board according to claim 1, wherein the at least one via is a through-hole that penetrates the base layer.

10. The circuit board according to claim 1, wherein the at least one via has plating on its inner surface.

11. The circuit board according to claim 10, wherein
   the plating is a conductive material, and
   the plurality of GND patterns are electrically coupled to each other through the plating.

12. The circuit board according to claim 1, wherein the at least two power supply layers are between the other layers in the multiple layers.

13. The circuit board according to claim 1, wherein the at least one via closer to a periphery of the multi-layer structure than the slot.

14. The circuit board according to claim 1, wherein the slot is closer to a periphery of the at least one via.

15. A circuit board, comprising:
   a base layer having a multi-layer structure that includes multiple layers, a plurality of dielectric layers, a plurality of ground (GND) patterns and a slot, wherein each dielectric layer of the plurality of dielectric layers is bonded between different layers of the multiple layers, the plurality of GND patterns is arranged in a portion of the multi-layer structure so that the plurality of GND patterns are provided to all layers of the multiple layers, and the plurality of GND patterns are electrically coupled to each other through at least one row of vias disposed on a perimeter of the circuit board; and
   a connector configured to couple to a wire harness carrying a signal, the connector being fixed to the slot, wherein
   the multiple layers include at least two power supply layers, and a thickness of the at least two power supply layers is greater than a thickness of other layers in the multiple layers, and
   the plurality of dielectric layers include a first dielectric layer arranged between two of the at least two power supply layers, and a thickness of the first dielectric layer is smaller than a thickness of other dielectric layers in the plurality of dielectric layers.

* * * * *